(12) United States Patent
Elian et al.

(10) Patent No.: US 7,793,550 B2
(45) Date of Patent: Sep. 14, 2010

(54) SENSOR DEVICE INCLUDING TWO SENSORS EMBEDDED IN A MOLD MATERIAL

(75) Inventors: Klaus Elian, Alteglofsheim (DE); Albert Auburger, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 52 days.

(21) Appl. No.: 12/197,623

(22) Filed: Aug. 25, 2008

(65) Prior Publication Data

US 2010/0043530 A1 Feb. 25, 2010

(51) Int. Cl.
*G01L 9/00* (2006.01)
(52) U.S. Cl. ....................................................... 73/754
(58) Field of Classification Search .................. None
See application file for complete search history.

(56) References Cited

U.S. PATENT DOCUMENTS

| 5,355,549 A | 10/1994 | Steinberg et al. |
| 2002/0053242 A1 | 5/2002 | Tai et al. |
| 2007/0144264 A1 | 6/2007 | Silverbrook et al. |

FOREIGN PATENT DOCUMENTS

| DE | 3207833 A1 | 9/1983 |
| DE | 3742673 A1 | 6/1989 |
| DE | 19802158 A1 | 7/1998 |
| EP | 0049955 A1 | 10/1980 |
| WO | 0140751 A1 | 6/2001 |

*Primary Examiner*—Andre J Allen
(74) *Attorney, Agent, or Firm*—Dicke, Billig & Czaja, PLLC (57) ABSTRACT

A sensor device. One embodiment provides a first sensor having a first sensor surface. The first sensor surface is exposed to allow sensing of a first variable. A second sensor has a second sensor surface. The second sensor surface is sealed to inhibit sensing of the first variable, and a mold material is embedded the first and second sensors.

28 Claims, 10 Drawing Sheets

SENSOR DEVICE INCLUDING TWO SENSORS EMBEDDED IN A MOLD MATERIAL

BACKGROUND

This invention relates to an electronic device including a sensor and a method of manufacturing thereof.

In the development of devices including sensors special requirements may be taken into account, in particular when designing the package of such a device. For example, sensors may react sensitively to mechanical stress that may occur during package fabrication or that may be caused by specific properties of the packages.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing two or more sensors are described below. A sensor measures (or senses) a physical variable, such as, for example, pressure, temperature, occurrence and/or quantity of a substance, magnetic field, humidity etc., and converts the measured variable to a signal which can be read by an observer or an instrument. Examples of sensors are pressure sensors, tire pressure sensors, gas sensors and humidity sensors. Sensors may include a sensor surface which allow to measure the desired variable. In the case of a pressure sensor, the sensor surface may be a surface of a membrane which is used for measuring the pressure of a gas or liquid. The sensors may be configured as MEMS (micro-electro mechanical systems) and may include micro-mechanical structures, such as bridges, membranes or tongue structures.

The sensors may be integrated in semiconductor chips. Furthermore, the devices described below may contain one or more additional semiconductor chips which do not contain sensors. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. The semiconductor chips may be configured as antennas and/or discrete passives and/or chip stacks. Semiconductor chips in which such functional elements are embedded generally contain electronic circuits which serve for driving the functional elements or further processing signals generated by the functional elements. The semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals. Moreover, the semiconductor chips may be packaged or unpackaged.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main faces of the semiconductor chips or on other faces of the semiconductor chips.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material, for example, of a metal, such as copper, aluminum or gold, a metal alloy or an electrically conductive organic material. Solder material, such as solder balls or solder bumps, may be deposited on the external contact elements.

The semiconductor chips or at least parts of the semiconductor chips may be covered with a mold material, which may be electrically insulating. The mold material may be made of any appropriate thermoplastic or thermosetting material. The mold material may be based on an epoxy material and may contain a filling material consisting of small particles of glass (SiO2) or other electrically insulating mineral filler materials like Al2O3 or organic filler materials. Various techniques may be employed to cover the semiconductor chips with the dielectric material, for example, compression molding, injection molding, powder molding, liquid molding and transfer molding.

The sensors, which may be integrated in semiconductor chips, as well as further semiconductor chips may be placed on carriers. The carriers may be of any shape, size or material. During the fabrication of the devices the carriers may be connected to each other. The carriers may also be made from one piece. The carriers may be connected among each other by connection means with the purpose of separating the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, for example, copper, copper alloys, iron nickel, aluminum, aluminum alloys, or other appropriate materials. The carriers may be, for example, a leadframe or a part of a leadframe. Furthermore, the carriers may be plated with an electrically conductive material, for example, copper, silver, iron nickel or nickel phosphorus.

Figure 1:
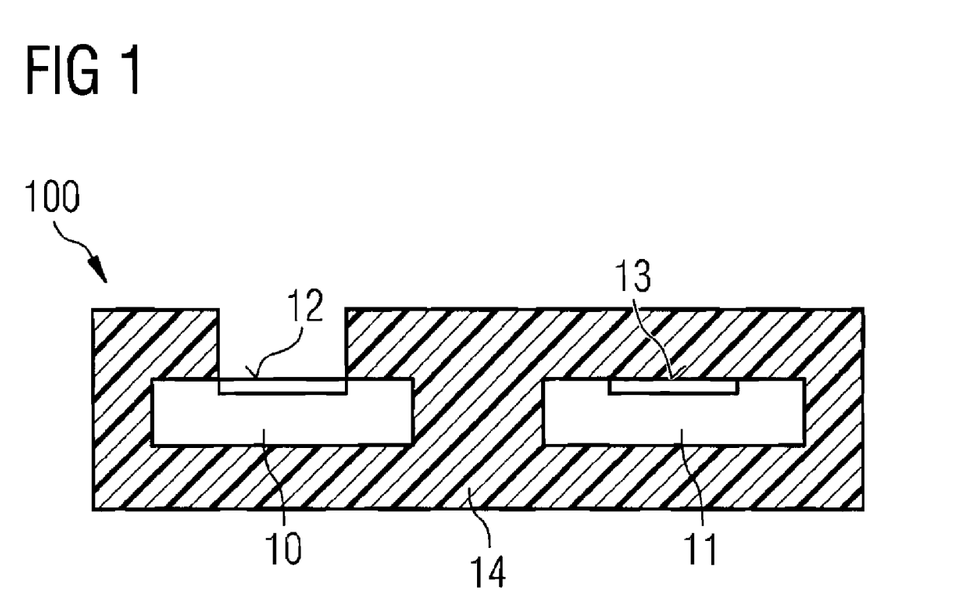
FIG. 1 schematically illustrates one embodiment of a device.

FIG. 1 schematically illustrates a device 100 in cross section. The device 100 includes a first sensor 10 and a second sensor 11. The first sensor 10 has a first sensor surface 12, which is exposed to allow sensing of a first variable. The second sensor 11 has a second sensor surface 13, which is sealed to inhibit sensing of the first variable. The first variable may, for example, be pressure, proportion of a gas, magnetic field or humidity. The first and second sensors 10, 11 are embedded in a mold material 14. In the present embodiment, the mold material 14 seals the second sensor surface 13. Instead of the mold material 14, other material may be used to seal the second sensor surface 13.

Figure 2A:
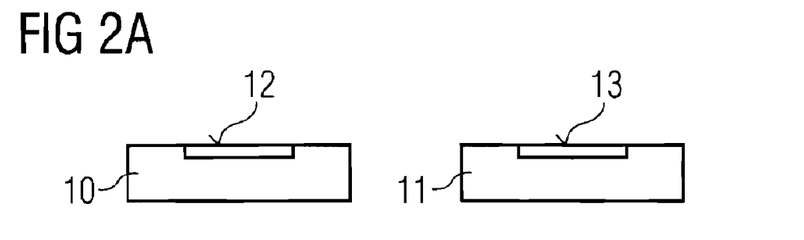
FIGS. 2A to 2C schematically illustrate one embodiment of a method to produce a device.
Figure 2B:
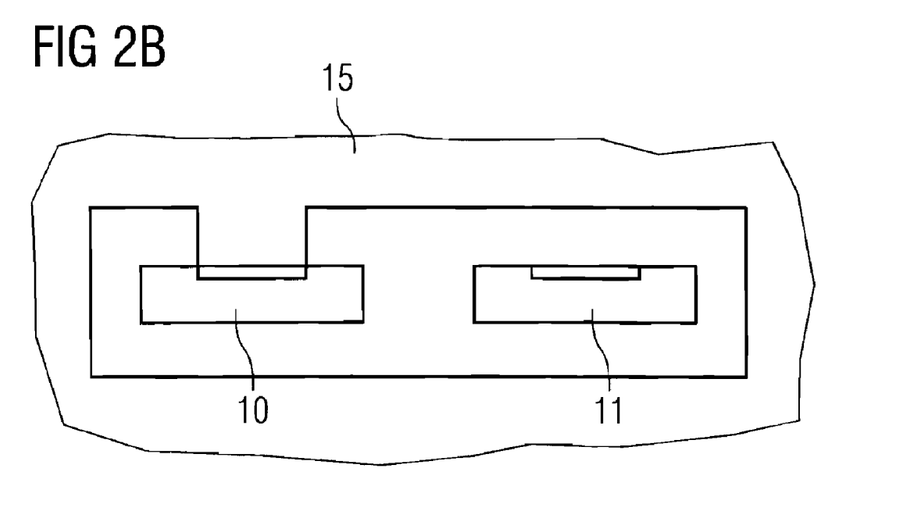
Figure 2C:
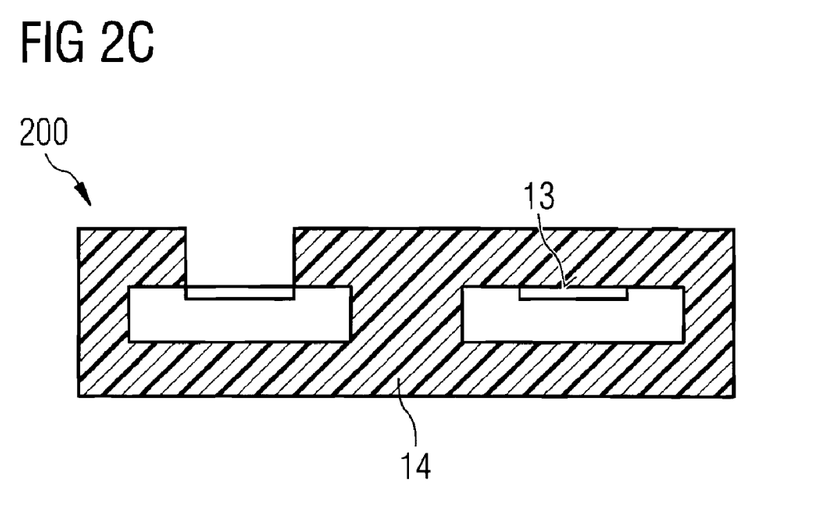

FIGS. 2A to 2C schematically illustrate a method for manufacturing a device 200, which is illustrated in cross section in FIG. 2C. First, a first sensor 10 having a first sensor surface 12 and a second sensor 11 having a second sensor surface 13 are provided (see FIG. 2A). The first and second sensors 10, 11 are placed in a mold cavity 15 (see FIG. 2B). The first and second sensors 10, 11 are covered with a mold material 14, and the second sensor surface 13 is sealed (see FIG. 2C). In the present embodiment, the mold material 14 seals the second sensor surface 13. Instead of the mold material 14, any other material may be used to seal the second sensor surface 13. Furthermore, the second sensor surface 13 may be sealed before the second sensor 11 is placed in the mold cavity 15.

Figure 3A:
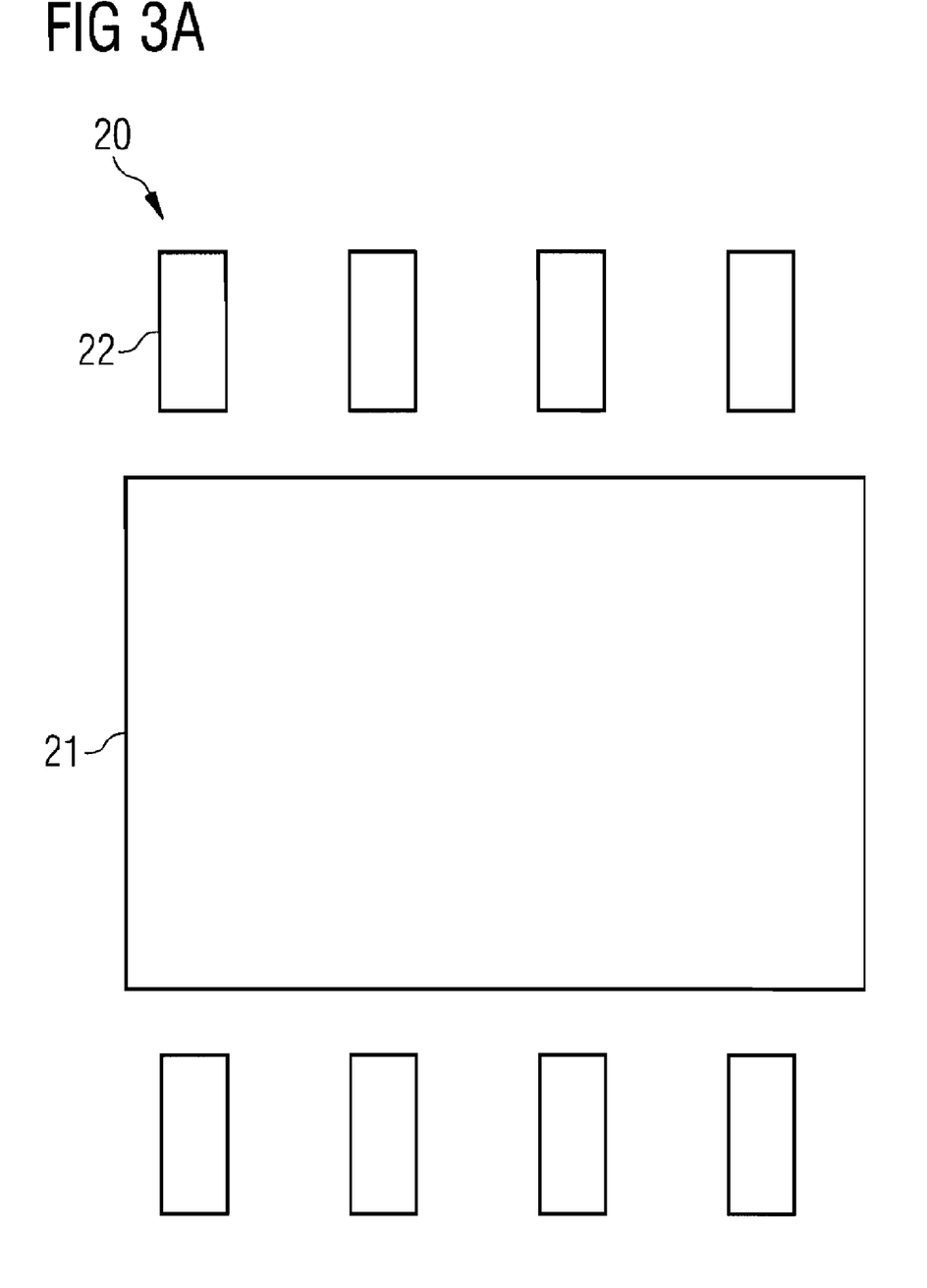
FIGS. 3A to 3E schematically illustrate one embodiment of a method to produce a device.
Figure 3B:
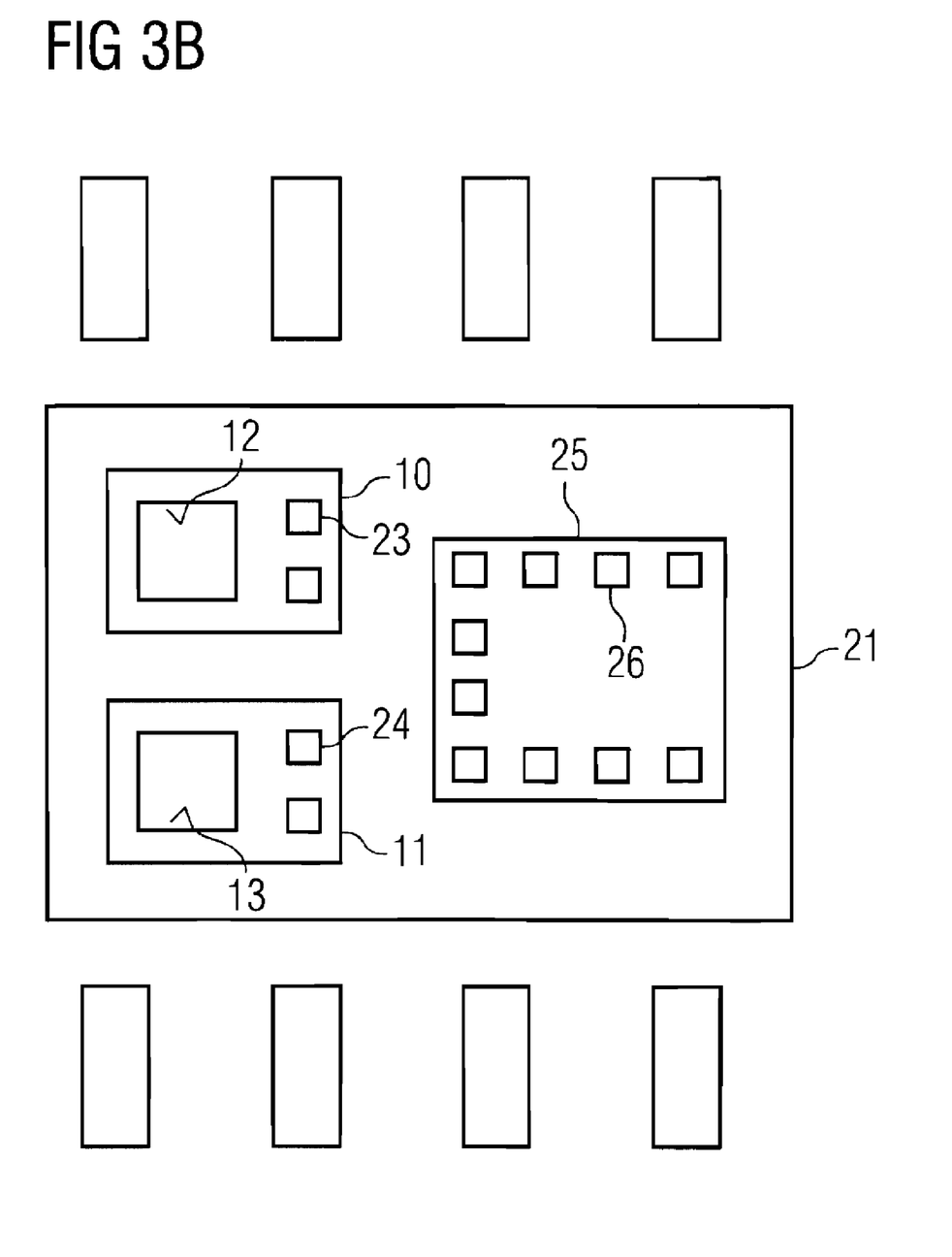
Figure 3C:
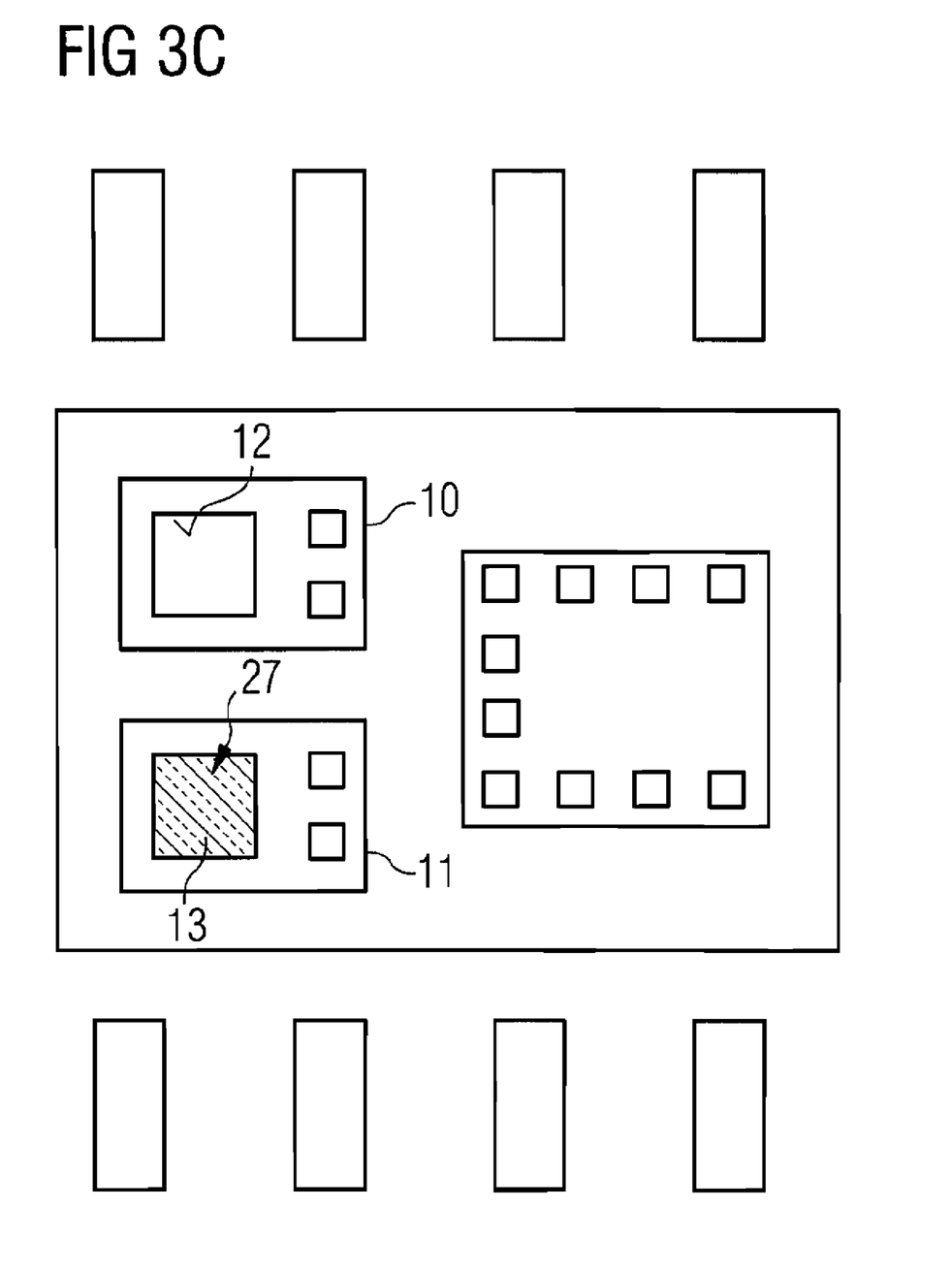
Figure 3D:
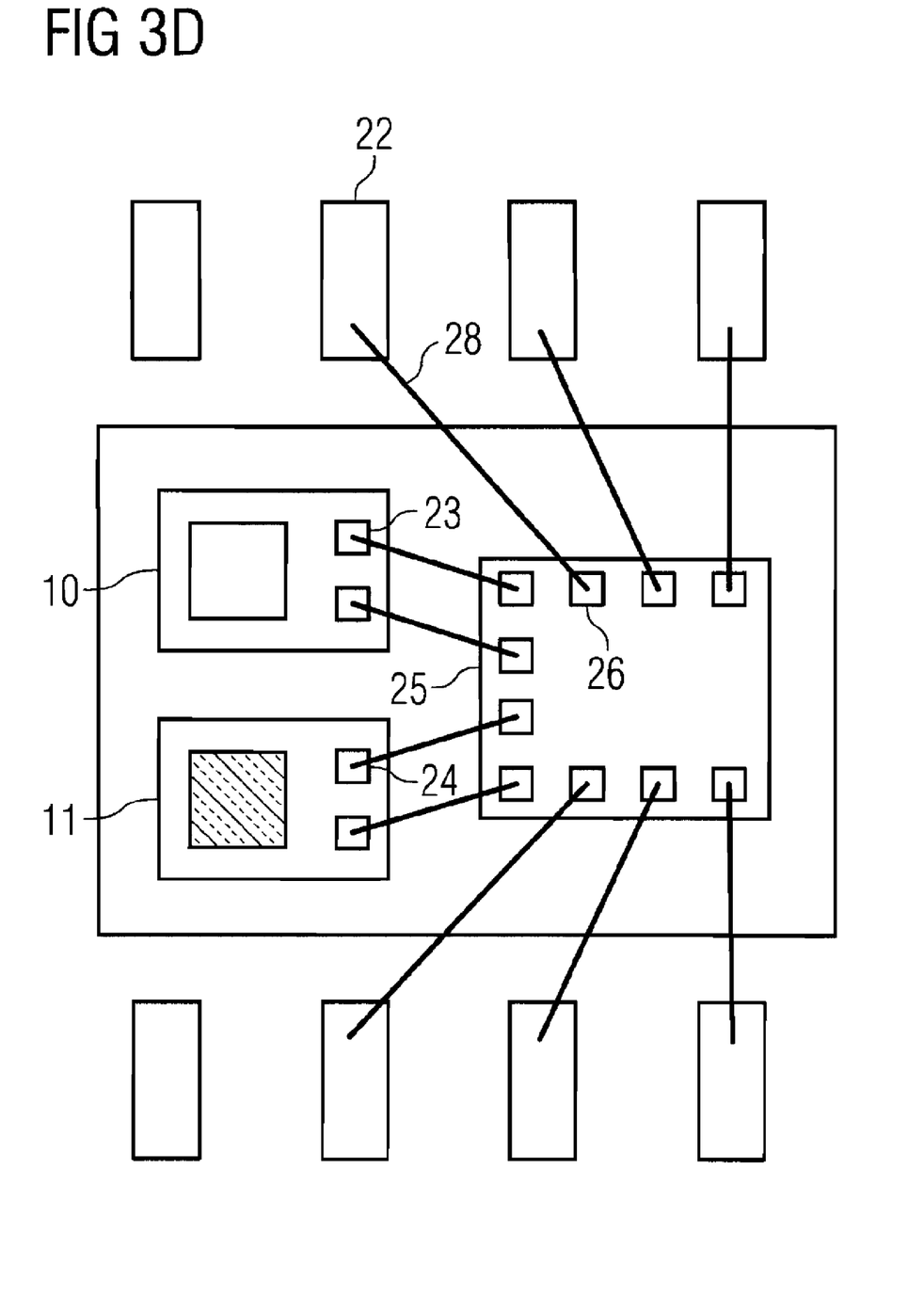
Figure 3E:
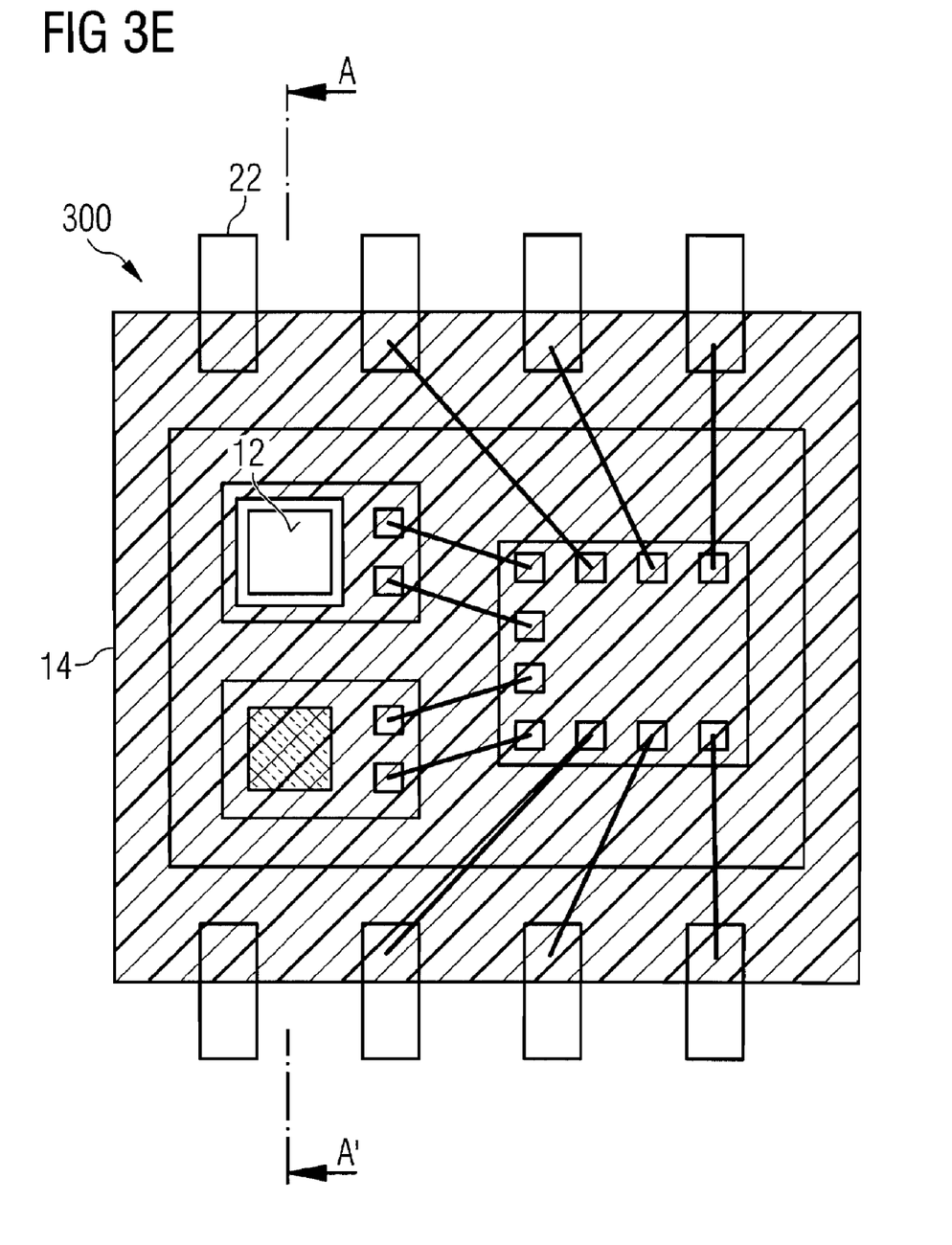

FIGS. 3A to 3E schematically illustrate a method for manufacturing a device 300, a cross section of which is illustrated in FIG. 3E. The device 300 is an implementation of the device 100. The details of the device 300 that are described below can therefore be likewise applied to the device 100. Furthermore, the method illustrated in FIGS. 3A to 3E is an implementation of the method illustrated in FIGS. 2A to 2C. The details of the production method that are described below can therefore be likewise applied to the method of FIGS. 2A to 2C.

In order to manufacture the device 300, a leadframe 20 may be provided which is illustrated in FIG. 3A in plan view. The leadframe 20 may include one or more die pads 21 and a plurality of leads 22. The leadframe 20 may be manufactured from a metal or metal alloy, for example, copper, a copper alloy, iron nickel, aluminum, or other appropriate materials. Furthermore, the leadframe 20 may be plated with an electrically conductive material, for example, copper, silver, iron nickel or nickel phosphorus. The shape of the leadframe 20 is not limited to any size or geometric shape. The leadframe 20 may have been manufactured by punching a metal plate. The die pads 21 and leads 22 of the leadframe 20 may be connected to each other by dams (not illustrated in FIG. 3A).

As illustrated in FIG. 3B, a first semiconductor chip 10 and a second semiconductor chip 11 are placed over the die pad 21. The first and second semiconductor chips 10, 11 contain the first and second sensors, respectively. In the present embodiment, the semiconductor chips 10, 11 are mounted on the die pad 21 with their sensor surfaces 12, 13 facing away from the die pad 21. The semiconductor chips 10, 11 may have contact pads 23, 24 on their surfaces facing away from the die pad 21 or on any other surface. The contact pads 23, 24 allow electrical contact to be made with the integrated circuits, in one embodiment the sensors included in the semiconductor chips 10, 11. Although in the embodiment illustrated in FIG. 3B each of the semiconductor chips 10, 11 has only two contact pads 23, 24, the semiconductor chips 10, 11 may have any number of contact pads 23, 24. The semiconductor chips 10, 11 may be attached to the die pad 21 by using an appropriate adhesive material.

A further semiconductor chip 25 may be mounted on the die pad 21. The semiconductor chip 25 may, for example, be an ASIC (Application Specific Integrated Circuit) and may be used to drive and control the semiconductor chips 10, 11 and to process output signals of the semiconductor chips 10, 11. The semiconductor chip 25 may contain an evaluation unit, the function of which is described further below. The semiconductor chip 25 may have any number of contact pads 26 on its surface facing away from the die pad 21 or on any other surface.

Additional semiconductor chips and/or components may be placed over the die pad 21. Furthermore, the leadframe 20 may contain further die pads, which are not illustrated in FIG. 3B and on which further semiconductor chips and/or components are placed.

The semiconductor chips 10, 11 and, in one embodiment, the sensors included in the semiconductor chips 10, 11 may be of the same type and, in one embodiment, may be identical. This means, for example, that both semiconductor chips 10, 11 include pressure sensors, for example, tire pressure sensors, or both semiconductor chips 10, 11 include gas sensors or humidity sensors. The semiconductor chips 10, 11 may have been fabricated on a wafer made of semiconductor material. After dicing the wafer and thereby separating the individual semiconductor chips 10, 11, the semiconductor chips 10, 11 are placed over the die pad 21. The semiconductor chips 10, 11 may have been manufactured on the same semiconductor wafer, but may in one embodiment have been manufactured on different wafers. Additionally, substrates made of glass, silicon or another semiconductor material may be stacked on top of the semiconductor chips 10, 11 and/or the semiconductor chips 10, 11 may be stacked on such substrates.

As illustrated in FIG. 3C, the sensor surface 13 of the semiconductor chip 11 may be sealed in order to inhibit sensing of the first variable. In contrast to the semiconductor chip 11, the sensor surface 12 of the semiconductor chip 10 may remain exposed in order to allow sensing on the first variable. Sealing of the sensor surface 13 may be carried out before or after the attachment of the semiconductor chip to the die pad 21.

In case the semiconductor chips 10, 11 are pressure sensors, they may include membranes for measuring the pressure of a gas or liquid. This measurement relies on the deflection of the membrane under an applied pressure difference. One side of the membrane is exposed to the pressure to be measured, while the other side of the membrane forms one wall of a sealed cavity filled, for example, with gas at a reference pressure. In the present embodiment, the sensor surface 12 is a surface of the membrane which is exposed to the pressure to be measured. Sealing of the sensor surface 13 in case of pressure sensors is described further below in more detail.

In case the semiconductor chips 10, 11 are gas sensors, they may include semiconductor surfaces functioning as the sensor surfaces 12, 13. If the sensor surface of a gas sensor is exposed to a gas, specific gas molecules adsorb onto the sensor surface, thereby changing the electrical conductivity of the sensor surface. This change in electrical conductivity may be measured in order to determine the occurrence of the desired gas and/or its proportion in the gas being analyzed. In order to seal the sensor surface 13 of the semiconductor chip 11 an electrically insulating layer 27 may be deposited on the sensor surface 13 as illustrated in FIG. 3C. For example, polytetrafluoroethylene (e.g., Teflon) may be sprayed on the sensor surface 13. Sealing of the sensor surface 13 with the electrically insulating layer 27 may be carried out before or after the attachment of the semiconductor chip 11 to the die pad 21.

After the attachment of the semiconductor chips 10, 11 and 25 to the die pad 21, electrical interconnections may be established from the contact pads 23, 24 of the semiconductor chips 10, 11 to the contact pads 26 of the semiconductor chip 25 and from the contact pads 26 to the leads 22 of the leadframe 20. Moreover, electrical interconnections between the contact pads 23, 24 of the semiconductor chips 10, 11 and the leads 22 may be provided. One example of these interconnections is illustrated in FIG. 3D where the interconnections are made by wire bonding. For example, ball bonding or wedge bonding may be used as the interconnect technique. The bond wires 28 may be made up of gold, aluminum, copper or any other appropriate electrically conductive material.

As alternatives to wire bonding, other interconnect techniques may be used. For example, metallic clips may be placed on the semiconductor chip 10, 11 and 25 as well as the leads 22 in order to establish the electrical interconnections.

A mold transfer process may be carried out to encapsulate the components arranged on the leadframe 20 with a mold material 14 as illustrated in FIG. 3E. The mold material 14 may encapsulate any portion of the device 300, but leaves at least parts of the sensor surface 12 of the semiconductor chip 10 and parts of the leads 22 uncovered. The exposed parts of the leads 22 may be used as external contact elements to electrically couple the device 300 to other components, for example, a circuit board, such as a PCB (Printed Circuit Board).

The exposed sensor surface 12 allows the semiconductor chip 10 to measure the first variable. The sensor surface 13 of the semiconductor chip 11 may be covered with the mold material 14 in order to seal the sensor surface 13. However, in case the sensor surface 13 is sealed by any other means, for example, the electrically insulating layer 27, the sensor surface 13 do not need to be covered with the mold material 14 and may be left exposed from the mold material 14.

In order to apply the mold material 14 to the components arranged on the leadframe 20, the leadframe 20 may be placed in a mold cavity (not illustrated in FIG. 3E). The mold cavity is a hollowed-out block that is filled with the mold material 14 after placing the leadframe 20 in the mold cavity. After the mold material 14 has hardened inside the mold cavity, the mold material 14 adopts the shape of the mold cavity.

The mold material 14 may be composed of any appropriate electrically insulating thermoplastic or thermosetting material, in one embodiment it may be composed of a material commonly used in contemporary semiconductor packaging technology. The mold material may be based on an epoxy material and may contain a filling material consisting of small particles of glass (SiO2) or other electrically insulating mineral filler materials like Al2O3 or organic filler materials. Various techniques may be employed to cover the components of the device 300 with the mold material 14, for example, compression molding, injection molding, powder molding, liquid molding and transfer molding.

Before or after the encapsulation with the mold material 14, the individual devices 300 are separated from one another by separation of the leadframe 20, for example, by sawing or cutting the dams. Afterwards, the leads 22 may be bent and/or trimmed in order to mount the device 300 on a circuit board. Instead of having the leads 22 protruding from the mold material 14 as illustrated in FIG. 3E, it is also possible to have a leadless device 300.

One of the purposes of the mold material 14 is to protect the semiconductor chips 10, 11 and 25 from environmental influences, such as, for example, dirt, wetness or mechanical impact. However, the encapsulation of the semiconductor chips 10, 11 and 25 with the mold material 14 causes mechanical stresses in the semiconductor chips 10, 11 and 25. The mechanical stress may, in one embodiment, influence the functions of the sensors integrated in the semiconductor chips 10, 11. Since the semiconductor chips 10, 11 are identical and are both encapsulated in the mold material 14, they experience substantially the same mechanical stress and the output signals produced by the semiconductor chips 10, 11 illustrate the same dependency on the mechanical stress caused by the encapsulation. However, the sensor surface 13 of the semiconductor chip 11 is sealed, whereas the sensor surface 12 of the semiconductor chip 10 is exposed. Thus only the sensor of the semiconductor chip 10 can measure the desired variable, for example, the pressure or the proportion of the gas, whereas the sensor of the semiconductor chip 11 is inhibited to measure this variable.

The sensor signal output by the semiconductor chip 10 consists of two components. One of the components indicates the measured variable and the other component reflects the mechanical stress induced to the semiconductor chip 10 by the mold material 14. Since the sensor of the semiconductor chip 11 cannot sense the desired variable, the sensor signal output by the semiconductor chip 11 only reflects the mechanical stress induced to the semiconductor chip 11 by the mold material 14. The sensor signals of both semiconductor chips 10, 11 are fed into the semiconductor chip 25, which may evaluate the two sensor signals. For example, the semiconductor chip 25 may compensate the influence of the mold material 14 from the sensor signal of the semiconductor chip 10, for example, by calculating the difference of the two sensor signals. Thus, as a result, the semiconductor chip 25 provides a sensor signal which is substantially free of the distortion caused by the mold material 14 and the molding process. This distortion-free sensor signal is similar to or substantially the same sensor signal which would be obtained if the semiconductor chip 10 is stress-free mounted in the device 300.

It is obvious to a person skilled in the art that the device 300 illustrated in FIG. 3E and the manufacturing thereof as described above are only intended to be an exemplary embodiment, and many variations are possible. For example, additional semiconductor chips or passives of different types may be included in the same device 300. The semiconductor chips and passives may differ in function, size, manufacturing technology etc.

Figure 4:
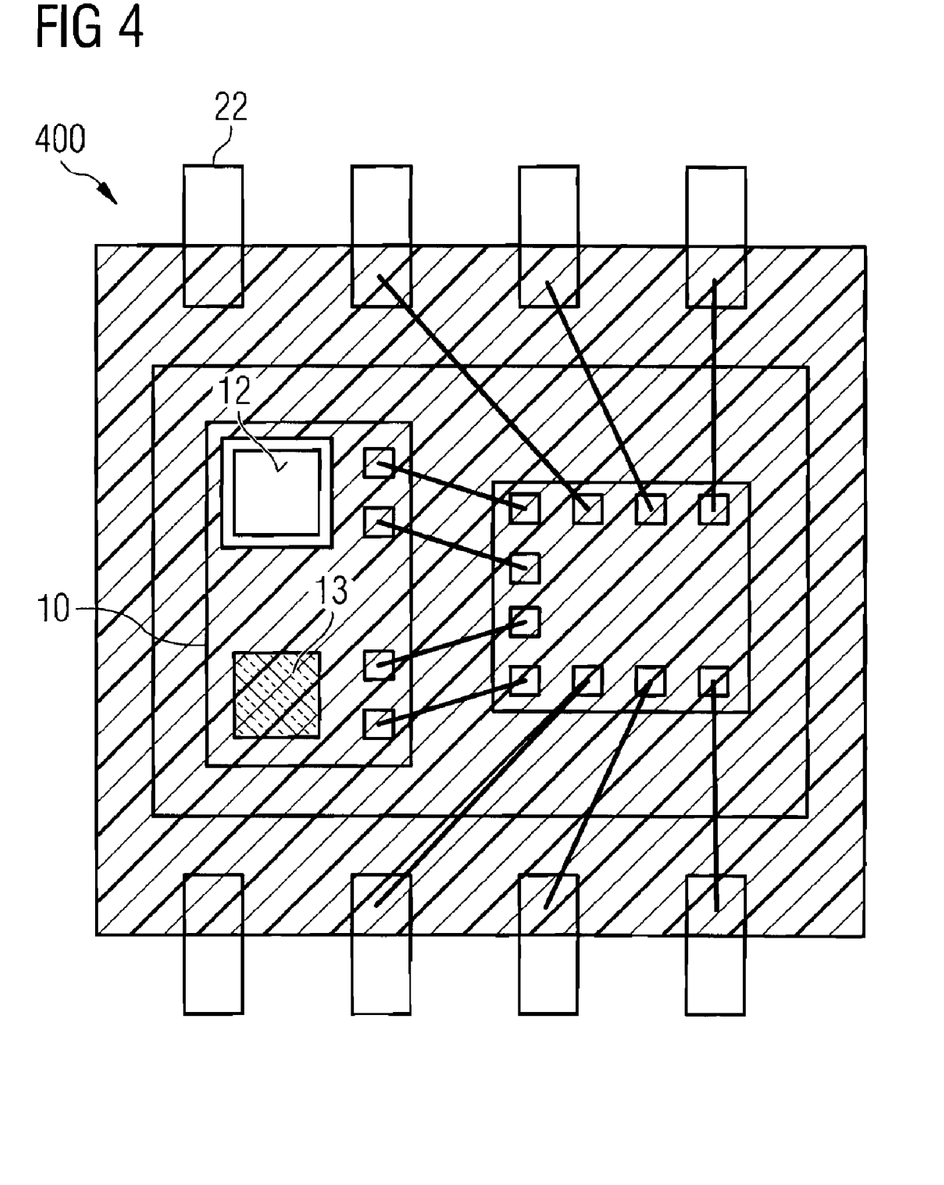
FIG. 4 schematically illustrates one embodiment of a device.

Furthermore, the first and second sensors may be integrated in the same semiconductor chip as illustrated in FIG. 4. The device 400, which is schematically illustrated in FIG. 4, is almost identical to the device 300, but the semiconductor chip 10 of the device 400 includes the first sensor and the second sensor so that the semiconductor chip 11 can be omitted. The sensor surface 12 of the first sensor is exposed, and the sensor surface 13 of the second sensor is sealed. The function of the device 400 is identical to the function of the device 300.

Figure 5:
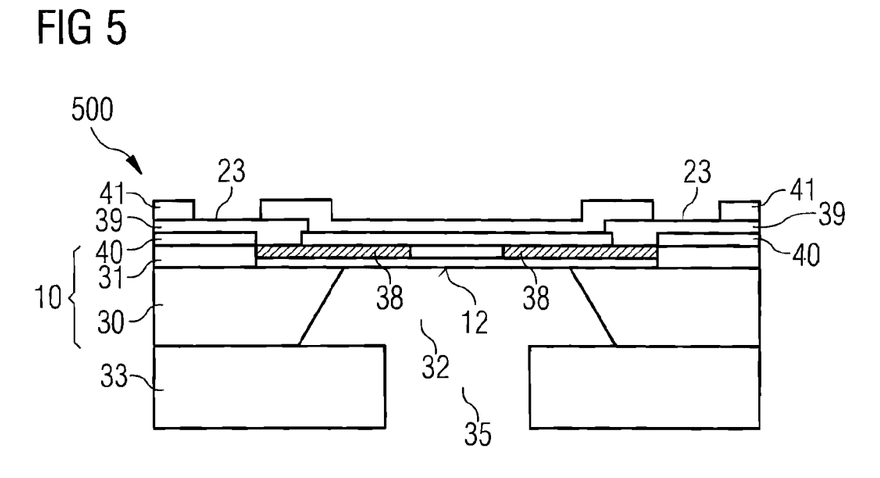
FIG. 5 schematically illustrates one embodiment of a pressure sensor.
Figure 6:
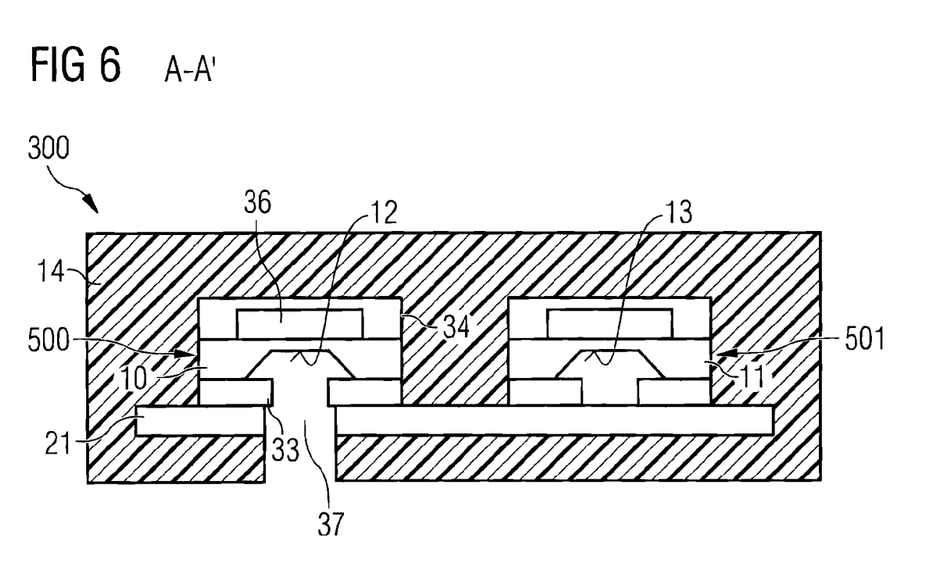
FIG. 6 schematically illustrates one embodiment of the device 300 including the pressure sensor.

FIG. 5 schematically illustrates an example of a pressure sensor 500. The pressure sensor 500 may, for example, be integrated in the device 300. This is exemplarily illustrated in FIG. 6, where a cross section of the device 300 along a line A-A' (cf. FIG. 3E) is illustrated. The pressure sensor 500 includes a sensor chip 10 which consists of a silicon chip 30, which in one embodiment may be manufactured of p-type doped silicon, and a membrane 31, which in one embodiment may be manufactured of n-typed doped silicon. The membrane 31 is arranged over a recess 32 formed in the silicon chip 30. The recess 32 exposes the sensor surface 12 of the pressure sensor 500. In the embodiment of FIG. 6, the sensor surface 12 faces towards the die pad 21.

When integrated in the device 300, the sensor chip 10 may be placed on a substrate 33. Furthermore, a substrate 34 may be stacked on top of the sensor chip 10 (only illustrated in FIG. 6). Both substrates 33 and 34 may be manufactured of glass, silicon or another semiconductor material. The substrates 33 and 34 may have been attached to the sensor chip 10 when the sensor chip 10 was still in the wafer bond. The substrates 33 and 34 may have been attached to the semiconductor wafer by anodic bonding and thereafter the semiconductor wafer may have been diced thereby separating the individual pressure sensors 500. The substrate 33 has a through-hole 35 in the area of the recess 32, and the substrate 34 has a recess 36 over the membrane 31. Furthermore, the die pad 21 has a through-hole 37 in order to expose the sensor surface 12 to the gas or liquid at a pressure to be sensed. The recess 36 in the substrate 34 forms a sealed cavity over the membrane 31. This cavity may be filled with a gas at a reference pressure. The deflection of the membrane 31 which is due to different pressures on both sides of the membrane 31 is a measure of the pressure to be sensed.

There are two main types of pressure sensor, resistive and capacitive. Both types of theses sensors rely on the deflection of the membrane 31 under an applied pressure difference. In one embodiment, the resistive-type pressure sensor 500 may employ a number of piezoresistors 38 on one face of the membrane 31. Two of these piezoresistors 38 are illustrated in FIG. 5. The piezoresistors 38 are electrically coupled to the contact pads 23 by conductor tracks 39, which may be made of any appropriate metal or metal alloy, for example, aluminum or copper. The conductor tracks 39 are arranged between electrically insulating layers 40 and 41, which may, for example, be made of silicon nitride, photoresist or any other appropriate electrically insulating material.

As illustrated in FIG. 6, the device 300 contains another pressure sensor 501 which is identical to the pressure sensor 500, but the die pad 21 and the mold material 14 seal the sensor surface 13 of the pressure sensor 501 to inhibit sensing the pressure of the surrounding gas or liquid. The pressure sensor 501 can only measure the mechanical stress impacting on the pressure sensor 501 due to the mold material 14. Thus the pressure sensor 501 acts as a reference sensor to measure the distortion of the sensor signal caused by the mold material 14.

Figure 7:
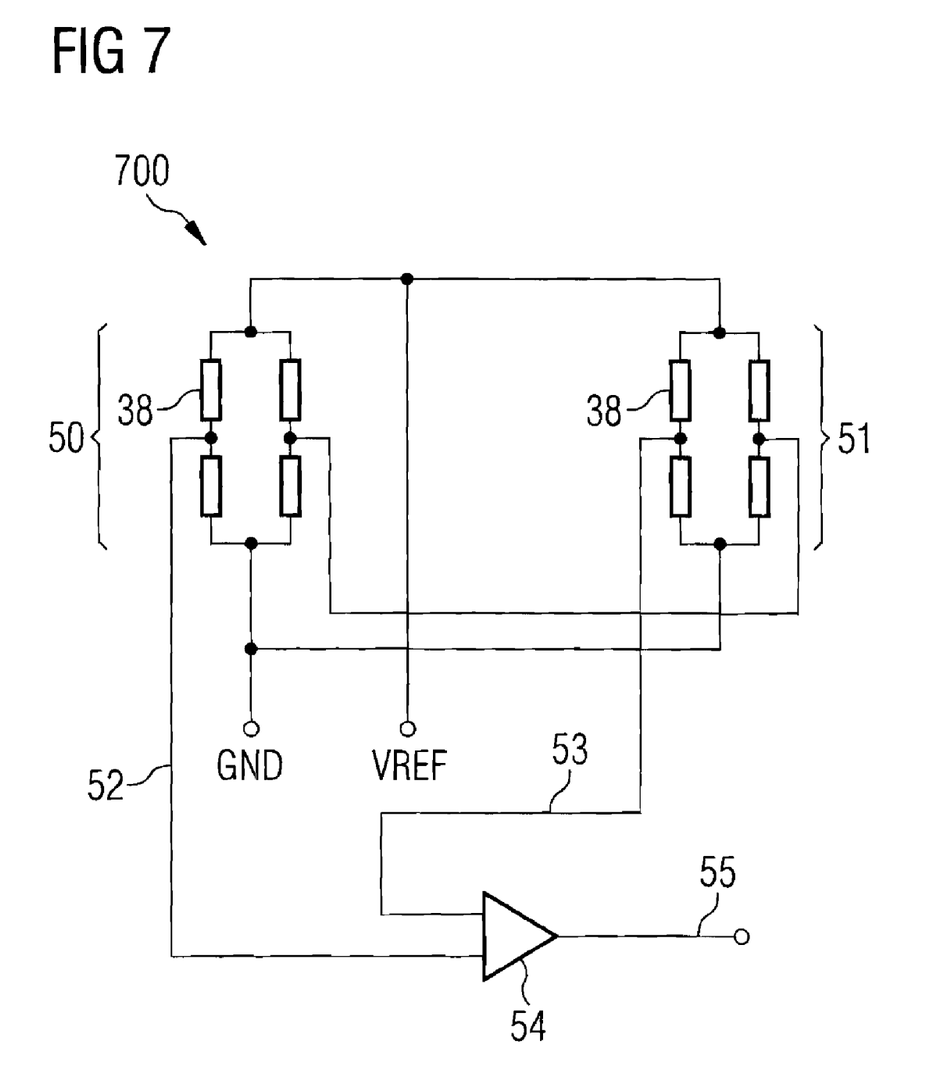
FIG. 7 schematically illustrates a measuring circuit.

The piezoresistors 38 arranged on the membrane 31 may form a Wheatstone bridge circuit. In FIG. 7 a Wheatstone bridge circuit 50 included in the pressure sensor 500 and a Wheatstone bridge circuit 51 included in the pressure sensor 501 are illustrated. The Wheatstone bridge circuits 50 and 51 are parts of a measuring circuit 700. The Wheatstone bridge circuit 50 provides a sensor signal 52, and the Wheatstone bridge circuit 51 provides a sensor signal 53. The sensor signals 52 and 53 are fed into the semiconductor chip 25, which contains a comparator 54, for example, an operational amplifier, to compare the sensor signals 52 and 53, for example, by forming the difference of the sensor signals 52 and 53. The comparator 54 outputs a sensor signal 55 which is free (or substantially free) of the distortion caused by the mechanical stress induced into the pressure sensors 500 and 501 by the encapsulation with the mold material 14.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device comprising:
    a first sensor formed from a silicon wafer, the first sensor having a recess and having a silicon membrane formed from the silicon wafer over the recess, with the membrane forming a first sensor surface, the first sensor surface being exposed to allow sensing of a first variable;
    a second sensor formed from another or the same silicon wafer, the second sensor having a recess and having a silicon membrane formed from the silicon wafer over the recess in the respective silicon wafer, with the membrane forming a second sensor surface, the second sensor surface being sealed to inhibit sensing of the first variable; and a mold material embedding the first and second sensors.

2. The device of claim 1, wherein the first sensor is integrated in a first semiconductor chip and the second sensor is integrated in a second semiconductor chip.

3. The device of claim 1, wherein the first and second sensors are integrated in the same semiconductor chip.

4. The device of claim 1, wherein the first and second sensors are pressure sensors.

5. The device of claim 1, wherein the first and second sensors are gas sensors.

6. The device of claim 1, further comprising an evaluation unit coupled to the first and second sensors.

7. The device of claim 6, wherein the mold material influences a first sensor signal from the first sensor and a second sensor signal from the second sensor, and
wherein the evaluation unit receives the first sensor signal from the first sensor and the second sensor signal from the second sensor and compares the first and second sensor signals and compensates for the influence of the mold material on the first sensor signal using the second sensor signal.

8. The device of claim 7, wherein the evaluation circuit forms the difference of the first sensor signal and the second sensor signal.

9. The device of claim 1, wherein the mold material seals the second sensor surface.

10. The device of claim 1, wherein the first and second sensors are placed over a carrier, which has a recess to expose the first sensor surface.

11. The device of claim 10, wherein the carrier seals the second sensor surface.

12. The device of claim 1, wherein the first and second sensors are identical.

13. The device of claim 1, further comprising:
a first glass wafer attached to the first main surface of the first sensor by anodic bonding; and
a second glass wafer attached to a second main surface of the first sensor by anodic bonding, the second main surface being opposite the first main surface.

14. The device of claim 1, wherein at least one of the silicon membranes comprises doped silicon.

15. A method, comprising:
providing a silicon wafer;
forming a membrane in the silicon wafer by forming a recess in the silicon wafer such that the membrane is positioned over the recess in the silicon wafer, wherein the silicon wafer, the recess, and the membrane form a first sensor and the membrane forms a first sensor surface;
providing a second sensor having a second sensor surface;
placing the first and second sensors in a mold cavity;
covering the first and second sensors with a mold material; and
sealing the second sensor surface.

16. A device, comprising:
a first sensor having a first sensor surface, the first sensor surface being exposed to allow sensing of a first variable and the first sensor outputting a first sensor signal;
a second sensor having a second sensor surface, the second sensor surface being sealed to inhibit sensing of the first variable and the second sensor outputting a second sensor signal;
a mold material embedding the first and second sensors, wherein the mold material causes mechanical stress in the first and second sensors and wherein the mechanical stress influences the first and second sensor signals; and
an evaluation unit to compare the first and second sensor signals and to compensate for the influence of the mechanical stress on the first sensor signal using the second sensor signal.

17. The method of claims 15, wherein the first and second sensors are identical.

18. The method of claim 17, comprising covering the first and second sensors with the mold material such that the first sensor surface remains at least partially exposed to allow sensing of a first variable.

19. The method of claim 18, comprising covering the first and second sensors with the mold material such that the second sensor surface is covered with the mold material.

20. The method of claim 18, comprising depositing an electrically insulating layer on the second sensor surface to inhibit sensing of the first variable.

21. The method of claim 17, comprising applying the mold material by at least one of compression molding, injection molding, powder molding, liquid molding and transfer molding.

22. The method of claim 17, comprising integrating the first sensor in a first semiconductor chip and integrating the second sensor in a second semiconductor chip.

23. The method of claim 17, comprising integrating the first and second sensors in the same semiconductor chip.

24. The method of claim 17, wherein the first and second sensors are pressure sensors.

25. The method of claim 17, wherein the first and second sensors are gas sensors.

26. The method of claim 17, further comprising:
anodic bonding of a first glass wafer to a first main surface of the first sensor; and
anodic bonding of a second glass wafer to a second main surface of the first sensor, the second main surface being opposite the first main surface.

27. The method of claim 17, further comprising:
doping the silicon wafer at the position of the membrane.

28. A method, comprising:
providing a first sensor having a first sensor surface;
providing a second sensor having a second sensor surface, the second sensor surface being sealed;
placing the first and second sensors in a mold cavity;
covering the first and second sensors with a mold material, wherein covering the first and second sensors with the mold material causes mechanical stress in the first and second sensors and influences an output signal of the first sensor and an output signal of the second sensor; and
using the output signal of the second sensor to compensate for the influences of the mold material on the output signal of the first sensor.

* * * * *

UNITED STATES PATENT AND TRADEMARK OFFICE
CERTIFICATE OF CORRECTION

PATENT NO. : 7,793,550 B2  Page 1 of 1
APPLICATION NO. : 12/197623
DATED : September 14, 2010
INVENTOR(S) : Elian et al.

It is certified that error appears in the above-identified patent and that said Letters Patent is hereby corrected as shown below:

Title page item (57), line 6, delete "embedded the first" and insert in place thereof --embedded in the first--.

Signed and Sealed this
Fourth Day of January, 2011

David J. Kappos
*Director of the United States Patent and Trademark Office*